United States Patent [19]
Finch et al.

[11] Patent Number: 5,592,616
[45] Date of Patent: Jan. 7, 1997

[54] METHOD FOR PERFORMING EFFICIENT MEMORY TESTING ON LARGE MEMORY ARRAYS USING TEST CODE EXECUTED FROM CACHE MEMORY

[75] Inventors: Richard W. Finch, Austin; Stephen R. Cooper, Cedar Park, both of Tex.

[73] Assignee: Dell USA, LP, Austin, Tex.

[21] Appl. No.: 481,634

[22] Filed: Jun. 7, 1995

[51] Int. Cl.6 .................................................. G06F 11/00
[52] U.S. Cl. ................................... 395/183.18; 395/445
[58] Field of Search ........................ 395/183.18, 183.01, 395/183.06, 184.01, 185.01, 186, 187.01, 183.22, 425; 371/21.1

[56]  References Cited

U.S. PATENT DOCUMENTS

| | | | |
|---|---|---|---|
| 4,654,783 | 3/1987 | Veres et al. | 364/200 |
| 4,959,777 | 9/1990 | Holman, Jr. | 364/200 |
| 5,230,052 | 7/1993 | Dayan et al. | 395/700 |
| 5,233,616 | 8/1993 | Callander | 371/37.1 |
| 5,249,281 | 9/1993 | Fuccio et al. | 395/425 |

*Primary Examiner*—Hoa T. Nguyen
*Attorney, Agent, or Firm*—Arnold, White & Durkee

[57]  ABSTRACT

In connection with a computer system, a method for performing efficient memory testing of large memory arrays in a single contiguous block is disclosed. Memory test code normally residing in ROM or flash memory is copied to a processor's primary (L1) cache via the processor's test registers. Once contained in the processor's L1 cache, the memory test code is executed to test all of system memory in a single, contiguous block, allowing a more complete test for memory-related faults. The method results in greatly improved performance because the only accesses external to the processor are memory test accesses, and because cache memory is typically high-speed as compared to RAM, ROM or flash memory.

14 Claims, 2 Drawing Sheets

METHOD FOR PERFORMING EFFICIENT MEMORY TESTING ON LARGE MEMORY ARRAYS USING TEST CODE EXECUTED FROM CACHE MEMORY

BACKGROUND OF THE INVENTION

This invention relates to a method for performing efficient and thorough memory testing on large arrays of computer system Random Access Memory (RAM) in single, contiguous blocks. The invention advantageously permits memory tests to be executed from high-speed cache memory existing on-board the central processing unit (CPU) of the computer system. Execution of the memory tests from the CPU cache permits effective testing of all of system RAM in one contiguous block while advantageously providing reasonable execution response time and performance.

For a system RAM memory test to be fully effective, the test must be capable of detecting functional memory faults of all varieties. Functional memory faults in computer system RAM come in several varieties. Typical types of faults include: "stuck-at" faults, where a memory cell is stuck at either a 1 or 0; "transition" faults, where one or more memory cells fail to undergo a 0 to 1, or 1 to 0 transition; "multiple access" faults, where more than one memory cell is accessed during a single read or write operation; and "coupling" faults, where a 0 to 1, or 1 to 0 transition in one memory cell causes a change in the contents of another memory cell.

In order to detect all of the possible types of memory faults, an effective memory test will test system RAM in a single, contiguous block. Without testing in single, contiguous blocks, certain types of faults (e.g., coupling faults) may go undetected. For example, if a memory cell at address 10000h is coupled to a memory cell at address 80000h, then a memory test that does not test the cell at address 10000h in the same contiguous block as the cell at 80000h will not detect the coupling fault.

Current operating system-based memory tests, such as those in off-the-shelf diagnostics software packages, have not been capable of detecting all types of memory, faults because they typically test system RAM in small blocks (e.g., 64 Kilobytes) or, alternatively, in two blocks. To date, single-block, contiguous memory testing has been accomplished via a personal computer system's Power On Self Test (POST) memory tests or via diagnostic memory tests residing in Read Only Memory (ROM) or flash memory, both of which suffer from slow access times. In order to achieve even marginally acceptable performance under this approach, many POST memory tests have been modified to run from system memory, rather than from much slower ROM or flash memory. While clearly boosting performance, this approach prevents a fully effective memory test on all of system RAM because the memory test code resides in system RAM, thereby preventing a complete test of the entire system RAM in one contiguous block.

Methods of memory testing used thus far have either failed to test adequately for all types of memory faults or performed too slowly due to execution of memory test code residing in slow access speed ROM or flash memory. Memory test code residing in the same system RAM address range as that being tested inhibits testing the entire range of system RAM in one contiguous block. On the other hand, performance is less than satisfactory when the memory test code is executed from slow access ROM or flash memory. As computer systems are equipped with more and more contiguous memory, the amount of time required to test large contiguous blocks of system memory is becoming an even more critical issue. Because of the slower access times of ROM or flash memory, memory test code executes so slowly that it is often impractical or undesirable to test large contiguous blocks of system memory.

Therefore, what is needed is a method for testing all of system RAM in one contiguous block, while, at the same time, providing reasonable performance.

SUMMARY OF THE INVENTION

In a method in accordance with the invention, memory test code is copied into high-speed cache memory associated with the CPU of the computer system. After the memory test code is copied into the cache, tag fields associated with the cache are initialized to assure that the memory test code resides in a memory address range outside of the system RAM address range. The cache is maintained in disabled status to "lock" the memory test code in the cache without danger of corruption. With the memory test code effectively "locked" in the cache, the memory test code is executed. Because the memory test code executes from a memory address range outside of the system RAM address range, all of system RAM can be tested in a single, contiguous block. Moreover, because the memory test code executes from higher speed cache memory, the execution time required for the memory test code to run is greatly improved over the methods found in the prior art.

DETAILED DESCRIPTION OF SPECIFIC EMBODIMENTS

One implementation of the invention is described here for purposes of illustration, namely a machine-executed method of testing system RAM in a single, contiguous block by copying memory test code from ROM, flash memory, or system RAM to higher speed cache memory associated with the CPU of a computer system. The machine-executed method is performed by computer code executed upon the start-up of a computer system, i.e., POST. An actual implementation of such computer code might be executable on an Intel 80×86-based or Pentium™-based computer system, or on other suitable processor-based computer systems.

(It will be appreciated by those of ordinary skill, of course, that references to the performance of method steps by a computer program actually mean that a computer, or one of its components, is performing the method steps in response to the instructions encoded in the computer program.)

In the interest of clarity, not all features of an actual implementation are described in this specification. It will, of course, be appreciated that in the development of any such actual implementation (as in any hardware or software development project), numerous design and programming decisions must be made to achieve the developers' specific goals and subgoals (e.g., compliance with system-related and business-related constraints), which will vary from one implementation to another. Moreover, attention will necessarily be paid to, e.g., proper serialization to handle concurrent events. It will be appreciated that a development effort of this type might be complex and time-consuming, but would nevertheless be a routine undertaking of computer system design and development for those of ordinary skill having the benefit of this disclosure.

Figure 1:
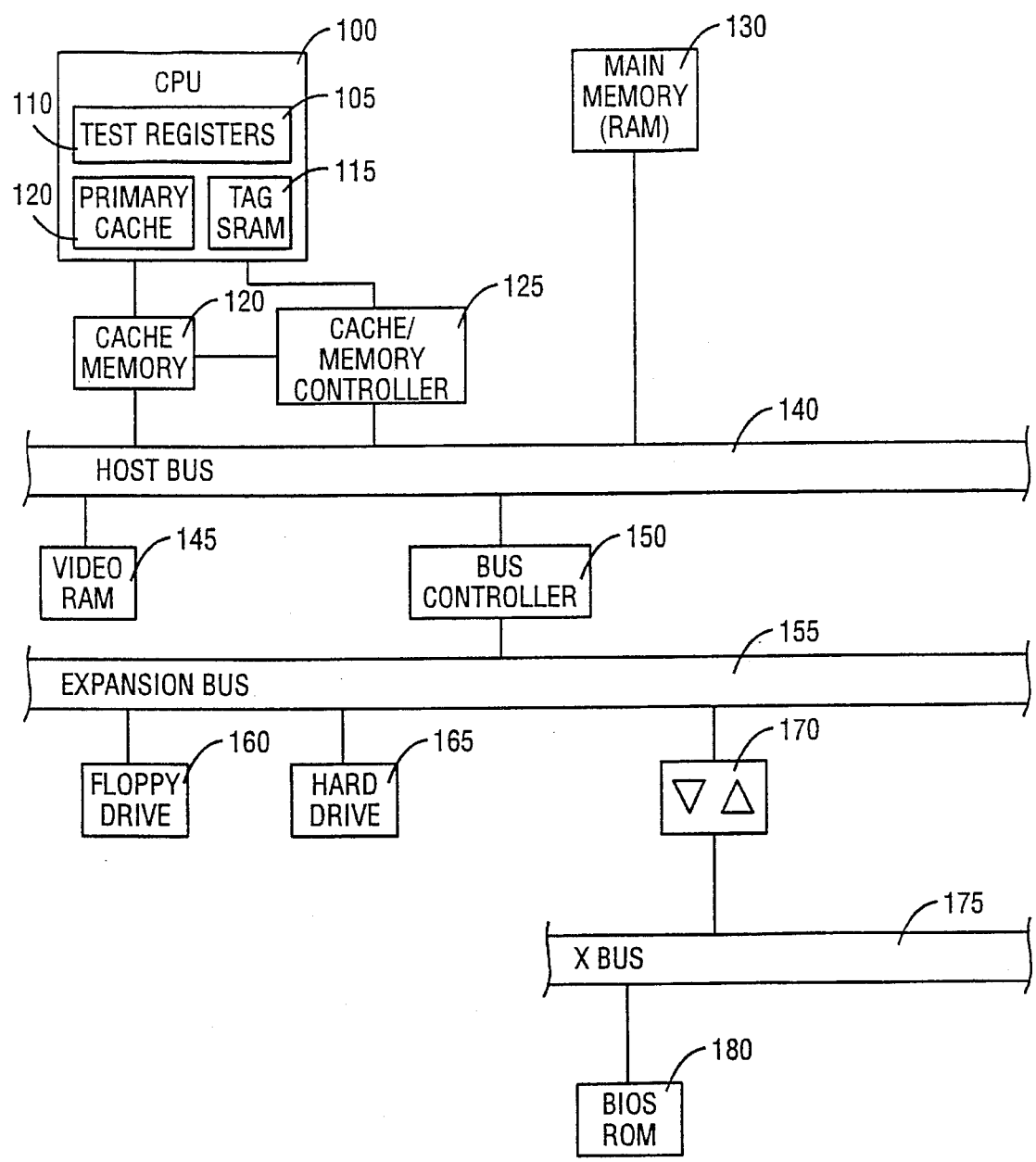
FIG. 1 is a block-diagram view of a computer system including depictions of components used in a method in accordance with the present invention.

Depicted in FIG. 1 is a computer system in which a method of the present invention for performing efficient memory testing on large memory arrays may be implemented. The elements of a computer system not necessary to understand the operation of the present invention have, in some instances, been omitted for simplicity. In other instances, certain elements of a computer system not necessary to understand the operation of the present invention have nevertheless been included to provide a more complete overview of the entire computer system in which the method of the present invention might be performed.

The computer system includes a CPU 100 which is coupled to a memory or host bus 140. The CPU 100 includes an internal (L1) processor cache 110, test registers 105, and tag SRAM 115 associated with each cache line of the L1 cache 110. External cache memory 120 is coupled between the CPU 100 and the host bus 140. The host bus 140 includes address, data, and control portions, as well as slots for various devices such as video RAM 145. Main system memory (system RAM) 130 comprised of dynamic RAM (DRAM) is coupled to the host bus 140.

A cache/memory controller 125 which integrates both cache controller and memory controller logic is coupled to the CPU 100, the cache memory 120, main memory or system RAM 130 and the host bus 140. The cache/memory controller 125 typically does not allow cache hits to tag addresses that are not cacheable or whose cacheability has been disabled.

The host bus 140 is coupled to an expansion or input/output (I/O) bus 155 by means of a bus controller 150. The expansion bus 155 includes slots for various other devices, including a floppy drive 160 and hard drive 165. The expansion bus 155 is also connected to a third peripheral bus referred to as the X bus 175 through a buffer 170. Coupled to the X bus 175 are slow-access ROM 180, which contains the executable memory test code. The ROM 180 is typically designated as non-cacheable by the cache/memory controller 125.

As discussed in the background portion, it is important that system RAM 130 be tested during POST in a single, contiguous block to ensure that all types of memory faults are detected. However, memory test code is most often embedded in slow ROM-based or flash memory-based BIOS 180. Execution time for memory test code contained in BIOS is unsatisfactorily slow. Faced with the reality of larger and larger amounts of system RAM available in computer systems, the execution of memory test code from BIOS during POST had become a dauntingly slow task. The present invention overcomes these problems by executing BIOS-embedded memory test code from the CPU's internal (L1) cache 110. Execution time for memory test code from the L1 cache results in far greater performance (see benchmark comparisons, supra), while simultaneously allowing all of system RAM to be tested in a single, contiguous block.

Figure 2:
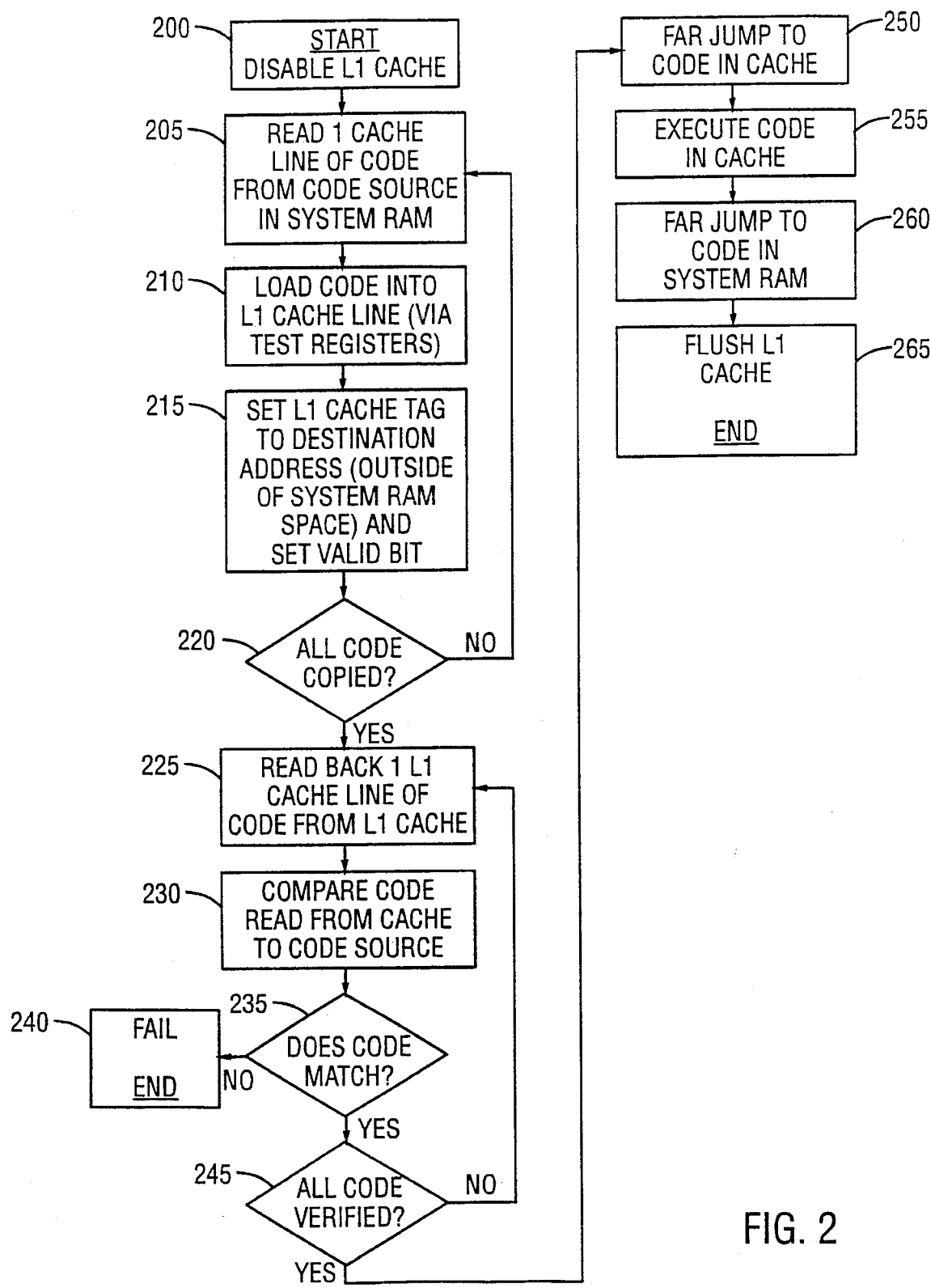
FIG. 2 is a flowchart representing a sequence of steps performed in accordance with such a method.

Referring to FIG. 2, at step 200 the internal (L1) processor cache 110 (FIG. 1) is disabled using cache control techniques well-known by those skilled in the art. Cache disablement, for example, is often accomplished via manipulation of the cache control bits CD and NW in Control Register zero (CR0). Cache disablement is necessary to avoid cache line invalidations that would normally result from the system memory accesses that follow in subsequent steps.

At step 205, a single cache line of memory test code is read from ROM 180, flash memory 180, or system RAM 130 (FIG. 1).

At step 210, the single cache line of memory test code from step 205 is written to one or more of the processor's test registers 105 (FIG. 1). For example, in the Intel 80386 and 80486 processors, access to the processor's test registers is accomplished via a move instruction, MOV. Access to the test registers of the Intel Pentium™ processor is accomplished via a write model-specific register instruction, WRMSR. Once in the processor's test registers 105 (FIG. 1), the single cache line of memory test code is moved into the L1 cache 110 (FIG. 1) using conventional test register to L1 cache loading techniques. Those of ordinary skill in the art will, of course, recognize that the method of the present invention need not be limited to using processor test registers for manually loading the L1 cache and setting the tag address fields. Any processor-supported means of manually loading the L1 cache and manually setting the tag address fields will suffice.

At step 215, the L1 cache tag address field 115 (FIG. 1) associated with the cache line from step 210 is set to a destination address beyond the address range for system RAM. For each cache line contained in one or more cache ways (or "banks"), there is associated a directory entry containing one or more tag address fields. By setting the destination address to an address outside of the address range for system RAM, the method of the present invention allows all of system RAM to be tested in one contiguous block by memory test code existing outside the memory address range being tested. Also at step 215, the tag valid bit of the affected cache directory entry is set to specify that the associated cache location contains valid data.

At step 220, if all lines of memory test code have not been read, control is passed back to step 205 where the next single cache line of memory test code is read. After all lines of memory test code have been read, control passes to step 225.

At step 225, the verification process begins by reading a single cache line of memory test code from the L1 cache 110 (FIG. 1). Verification of the memory test code in the L1 cache assures that a complete and accurate copy is available in the L1 cache prior to actual execution.

At step 230, the single cache line of memory test code is compared to the associated line of memory test code found in system memory (e.g., whether found in either system RAM 130 or ROM 180 (FIG. 1)).

At step 235, if the comparison in step 230 results in a determination that the code does not match, control is passed to step 240, indicating a failure condition and resulting in termination.

At step 245, if all lines of code have been verified, control passes to step 250. Otherwise, control returns to step 225 where another single line of cache code is read.

At step 250, after all code has been verified, a far jump instruction to the memory test code within the L1 cache occurs.

At step 255, the memory test code within the L1 cache is executed.

At step 260, a far jump instruction to code in system RAM occurs.

Finally, at step 265, the L1 cache 110 (FIG. 1) is flushed and re-enabled.

Those of ordinary skill in the art will recognize that ROM or flash memory is normally non-cacheable. However, the method of the present invention provides a method of making ROM or flash memory cacheable in-place. This method could be extended to vastly improve the performance of any code that resides in a normally non-cacheable location (e.g., ROM or flash memory). In the case of system RAM testing, the method of the present invention assures performance gains because no accesses external to the processor will occur other than the memory test accesses themselves. Performance is greatly improved as compared to running code from ROM or flash memory where the majority of accesses external to the processor are code fetches from these slower memory types. Performance is also greatly improved over running code from RAM where code access cycles are performed on the system bus.

Those of ordinary skill in the art will also recognize that, using existing suspend/resume functionality, the teachings of the present invention could be extended and used by operating system-based diagnostic utilities. For example, using suspend/resume functionality, the diagnostics utility could save the contents of system RAM to disk storage, load memory test code into the L1 cache using the method of the present invention, execute the memory test code from the L1 cache to test all of system RAM in one contiguous block, and, finally, restore the contents of system RAM from disk storage. As with the embodiment already described, such an approach would result in a complete and effective memory test of system RAM in one contiguous block. Moreover, this approach would deliver exceptional performance due to code execution from the high-speed L1 cache.

For the purpose of illustrating the magnitude of performance enhancement that can be realized by the utilization of the method of the present invention, a series of benchmarks was run comparing the execution speeds of memory test code when run from flash memory, video RAM, system RAM, and from a "locked" L1 cache. The benchmarks were run on a 90 MHz Pentium™ system with an Intel 82430 PCIset cache/memory subsystem and 16 MB of system RAM installed. The benchmark test consisted of loading memory test code into the target memory types (i.e., either flash memory, video RAM, system RAM, or L1 cache), and then executing the memory test code. The memory test itself was run on a 512 K block of memory starting at address 00100000h (1 MB). The test algorithm was:

1. Fill from 0 to N double words (DWORDS) with 0's
2. For 0 to N DWORDS:
   (a) Read and verify 0's
   (b) Write 1's
   (c) Read and verify 1's
   (d) Write 0's
   (e) Read and verify 0's
   (f) Write 1's
3. For 0 to N DWORDS:
   (a) Read and verify 1's
   (b) Write 0's
   (c) Write 1's
4. For N to 0 DWORDS:
   (a) Read and verify 1's
   (b) Write 0's
   (c) Write 1's
   (d) Write 0's
5. For N to 0 DWORDS:
   (a) Read and verify 0's
   (b) Write 1's
   (c) Write 0's The benchmark tests were run several times with relatively consistent results. The results recorded, presented only for purposes of illustration, are as follows:

| Code running from: | Elapsed time | Performance factor |
| --- | --- | --- |
| Flash RAM | 21.63 seconds | 66.39× |
| Video RAM | 14.33 seconds | 43.98× |
| System RAM | 1.610 seconds | 4.94× |
| L1 Cache | 325.8 milliseconds | 1× |

It will be appreciated by those of ordinary skill having the benefit of this disclosure that numerous variations from the foregoing illustration will be possible without departing from the inventive concept described therein. Accordingly, it is the claims set forth below, and not merely the foregoing illustrations, which are intended to define the exclusive rights claimed in this application.

What is claimed is:

1. A machine-executed method for performing efficient memory testing on large RAM arrays in a computer system, said computer system including a CPU having at least one cache buffer, and said large RAM arrays having a definable address space, wherein executable memory test code is stored in ROM, flash memory, or said RAM arrays of said computer system, said method comprising:

(a) copying said memory test code into said processor cache buffer;

(b) initializing said processor cache buffer to assure that said memory test code resides in an address space separate from said address space for said large RAM arrays;

(c) disabling said processor cache buffer to prevent corruption of said memory test code in said processor cache buffer; and (d) executing said memory test code from said processor cache buffer to test the entire RAM arrays in a single, contiguous block.

2. A method in accordance with claim 1, the step of copying said memory test code into said processor cache buffer, comprising:

(a) copying said memory test code from said ROM or flash memory into one or more processor test registers included in said CPU; and (b) copying said memory test code from said one or more processor test registers to said processor cache buffer.

3. A method in accordance with claim 1, the step of copying said memory test code into said processor cache buffer, comprising:

(a) copying said memory test code from said ROM or flash memory into one or more intermediate storage elements of said computer system, the contents of said intermediate storage elements capable of being manually loaded into said processor cache buffer; and (b) copying said memory test code from said intermediate storage elements to said processor cache buffer.

4. A method in accordance with claim 1, the step of initializing said processor cache buffer comprising, initializing a tag field in a tag memory included in said CPU associated with said processor cache buffer to reference a memory array address beyond said address space for said large RAM arrays.

5. A method in accordance with claim 2, wherein said CPU is an Intel 80×86-type microprocessor.

6. A method in accordance with claim 2, wherein said CPU is an Intel Pentium™ microprocessor.

7. A machine-executed method for efficient execution of executable code existing in a normally non-cacheable storage location has been inserted; then after "computer system", in a computer system, said computer system including a CPU having at least one cache buffer associated with said CPU, said method comprising:

(a) copying said executable code into said cache buffer;

(b) initializing said cache buffer to assure that said executable code resides in an address space separate from, the address space of said non-cacheable storage location or said system memory;

(c) disabling said cache buffer to prevent corruption of said executable code in said processor cache buffer; and (d) executing said executable code to test the entire system memory in a single, contiguous block.

8. A method in accordance with claim 7, wherein the step of copying said executable code into said processor cache buffer is performed by:

(a) copying said executable code from said non-cacheable storage location or said system memory into one or more processor test registers in said CPU; and (b) copying said executable code from said one or more processor test registers to said processor cache buffer.

9. A method in accordance with claim 7, the step of initializing said processor cache buffer comprising, initializing a tag field in a tag memory included in said CPU associated with said processor cache buffer to reference a memory array address beyond said address space for said non-cacheable storage location or said system memory.

10. A machine-executed method for performing efficient memory testing on large RAM arrays in a computer system, said computer system including a CPU having at least one cache buffer associated with said CPU, and said large RAM arrays having a definable address space, wherein executable memory test code is stored in ROM, flash memory, or said RAM arrays of said computer system, said method comprising:

(a) disabling said cache buffer to prevent corruption of said memory test code to be copied into said processor cache buffer;

(b) copying said memory test code into said cache buffer;

(c) initializing said cache buffer to assure that said memory test code resides in an address space separate from said address space for said large RAM arrays;

(d) validating that said memory test code copied into said cache buffer is consistent with said memory test code located in said ROM, flash memory or RAM arrays; and (e) executing said memory test code in said cache buffer to test the entire RAM arrays in a single, contiguous block.

11. A method in accordance with claim 10, the step of initializing said processor cache buffer comprising, initializing a tag field in a tag memory in said CPU associated with said processor cache buffer to reference a memory array address beyond said address space for said large RAM arrays.

12. A machine-executed method for performing efficient memory testing on large RAM arrays in a computer system, said computer system including a CPU having at least one cache buffer associated with said CPU, and said large RAM arrays having a definable address space, wherein executable memory test code is stored in ROM, flash memory, or said RAM arrays of said computer system, said method comprising:

(a) disabling said cache buffer to prevent corruption of said memory test code to be copied into said processor cache buffer;

(b) performing each of the following substeps for each cache line of said memory test code stored in said ROM, flash memory, or RAM arrays:

(1) copying one or more cache lines of said memory test code into one or more test registers associated with said CPU;

(2) copying said one or more cache lines of said memory test code from said one or more test registers into one or more cache lines of said cache buffer; and (3) initializing said one or more cache lines of said cache buffer by initializing a tag field associated with said one or more cache lines contained in said cache buffer to test the entire RAM arrays in a single, contiguous block to reference a memory array address beyond said address space for said large RAM arrays; and (c) executing said memory test code in said cache buffer.

13. A method in accordance with claim 12, said step of executing said memory test code comprising, executing a far jump instruction to an address location corresponding to the start of said memory test code in said cache buffer.

14. A method in accordance with claim 12 further comprising, after said executing step:

(d) flushing said cache buffer; and (e) re-enabling said cache buffer.

* * * * *

UNITED STATES PATENT AND TRADEMARK OFFICE
CERTIFICATE OF CORRECTION

PATENT NO. : 5,592,616

DATED : January 7, 1997

INVENTOR(S) : Richard W. Finch and Stephen R. Cooper

It is certified that error appears in the above-identified patent and that said Letters Patent is hereby corrected as shown below:

In column 6, lines 64-67, and column 7, lines 1-12, delete claim 1 in its entirety, and substitute therefor:

--7. A machine-executed method for efficient execution of executable code existing in a normally non-cacheable storage location or in a system memory in a computer system, said computer system to test said system memory including a CPU having at least one cache buffer associated with said CPU, said method comprising:

(a) copying said executable code into said cache buffer;

(b) initializing said cache buffer to assure that said executable code resides in an address space separate from the address space of said non-cacheable storage location or said system memory;

(c) disabling said cache buffer to prevent corruption of said executable code in said processor cache buffer; and (d) executing said executable code to test the entire system memory in a single, contiguous block.

UNITED STATES PATENT AND TRADEMARK OFFICE
CERTIFICATE OF CORRECTION

PATENT NO.     :    5,592,616

DATED          :    January 7, 1997

INVENTOR(S)    :    Richard W. Finch and Stephen R. Cooper

It is certified that error appears in the above-identified patent and that said Letters Patent is hereby corrected as shown below:

In column 8, lines 31-38, claim 12, delete lines 31-38 in their entirety, and substitute therefor:

(3) initializing said one or more cache lines of said cache buffer by initializing a tag field in a tag memory in said CPU associated with said one or more cache lines contained in said cache buffer to reference a memory array address beyond said address space for said large RAM arrays; and (c) executing said memory test code in said cache buffer to test the entire RAM arrays in a single, contiguous block.--.

Signed and Sealed this

Twentieth Day of May, 1997

Attest:

BRUCE LEHMAN

Attesting Officer     Commissioner of Patents and Trademarks